United States Patent
Tsai et al.

(10) Patent No.: US 8,273,642 B2
(45) Date of Patent: Sep. 25, 2012

(54) METHOD OF FABRICATING AN NMOS TRANSISTOR

(75) Inventors: Chen-Hua Tsai, Hsinchu County (TW); Po-Jui Liao, Taichung (TW); Tzu-Feng Kuo, Hsinchu (TW); Ching-I Li, Tainan (TW); Cheng-Tzung Tsai, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 47 days.

(21) Appl. No.: 12/897,771

(22) Filed: Oct. 4, 2010

(65) Prior Publication Data
US 2012/0083090 A1    Apr. 5, 2012

(51) Int. Cl.
*H01L 21/425* (2006.01)

(52) U.S. Cl. ........ 438/514; 438/229; 438/595; 438/914; 257/E21.041

(58) Field of Classification Search .......... 438/199, 438/229–232, 514, 595, 914; 257/E21.632, 257/E21.345, E21.043, E21.057, E21.626, 257/E21.64, E21.041
See application file for complete search history.

(56) References Cited

U.S. PATENT DOCUMENTS

| | | | |
|---|---|---|---|
| 7,122,435 B2 * | 10/2006 | Chidambaram et al. | 438/303 |
| 7,550,336 B2 | 6/2009 | Hsiao | |
| 7,601,996 B2 * | 10/2009 | Ohta et al. | 257/213 |
| 2006/0244080 A1 * | 11/2006 | Chen et al. | 257/408 |
| 2007/0029608 A1 * | 2/2007 | Huang | 257/327 |

OTHER PUBLICATIONS

P. W. Liu, T. F. Kuo, C. I. Li, Y. R. Wang, R. M. Huang, C. H. Tsai, C. T. Tsai, and G. H. Ma, "Dopant and Thermal Interaction on SPE formed SiC for NMOS Performance Enhancement", IEEE, 2009, pp. 24-25.

* cited by examiner

*Primary Examiner* — Michelle Mandala
(74) *Attorney, Agent, or Firm* — Winston Hsu; Scott Margo

(57) ABSTRACT

A SiC region and a source/drain region are formed such that the SiC region includes a first portion overlapping the source/drain region and a second portion protruding from the source/drain region to a position beneath the LDD region. The concentration of crystalline SiC in the second portion is higher than the concentration of crystalline SiC in the first portion. The SiC region may be formed through a normal implantation before the second spacer is formed, or the SiC region may be formed through a tilt implantation or deposition epitaxially in a recess having a sigma-shape like sidewall after the second spacer is formed.

18 Claims, 7 Drawing Sheets

US 8,273,642 B2

METHOD OF FABRICATING AN NMOS TRANSISTOR

BACKGROUND OF THE INVENTION

1. Field of the Invention

The present invention relates to a method of fabricating an NMOS (n type metal-oxide-semiconductor) transistor.

2. Description of the Prior Art

Strained-Si scheme has become essential for 45 nm and beyond CMOS technology. For example, the embedded SiGe (eSiGe) is introduced into the S/D area to enhance PMOS performance, and, the embedded silicon carbide (eSiC) in the S/D area is for enhancing NMOS performance due to large tensile stress resulted from the smaller lattice constant of SiC. There are two different approaches to form the eSiC S/D. One is to recess S/D region and to grow SiC directly using selective epitaxy process. Another is to use carbon ion implantation to pre-amorphize silicon in a source/drain region and solid phase epitaxy (SPE) anneal to form SiC in the S/D region. The resultant MOS structure is obtained as shown in FIG. 1. In which, the source/drain region 12 is formed through doping a dopant using a first spacer 14, a second spacer 16, and a gate structure 18 as a mask. SiC is formed after the source/drain region 12 is formed and accordingly mainly distributed within an upper portion 20 of the source/drain region 12 in a proximately uniform concentration as shown by a referral number 22.

However, the great increase of the sheet resistance (Rs) in doped SPE SiC will offset the performance gain obtained from the strain effect. Moreover, the high temperature thermal processes will induce carbon atom precipitation out from substitutional sites and reduce the channel stress.

Therefore, there is still a need for a novel method to fabricate an NMOS transistor having relatively high SiC concentration for increasing electron mobility while without increasing sheet resistance (Rs).

SUMMARY OF THE INVENTION

One objective of the present invention is to provide a method for fabricating an NMOS transistor having improved electron mobility while the Rs is not significantly increased.

In one aspect of the present invention, the method for fabricating an NMOS transistor includes providing a silicon substrate having a gate structure thereon; forming a first spacer on a sidewall of the gate structure; forming a lightly doped drain (LDD) region in the silicon substrate at each of two sides of the gate structure; forming a second spacer on the first spacer; and after forming the second spacer, forming a SiC region and an S/D region in the silicon substrate at each of two sides of gate structure, wherein the SiC region comprises a first portion overlapping the S/D region and a second portion protruding from the S/D region to a position beneath the LDD region, wherein a second concentration of crystalline SiC in the second portion is higher than a first concentration of crystalline SiC in the first portion.

In another aspect of the present invention, the method for fabricating an NMOS transistor includes providing a silicon substrate having a gate structure thereon; forming a first spacer on a sidewall of the gate structure; implanting carbon atoms at a normal angle into the silicon substrate for pre-amorphizing the silicon of the silicon substrate in a predetermined S/D region and beneath a predetermined lightly doped drain (LDD) region at each of the two sides of the gate structure; after implanting the carbon atoms, implanting an n type dopant into the silicon substrate in the predetermined LDD regions; performing a rapid thermal process for forming the crystalline SiC and simultaneously forming the LDD regions; forming a second spacer on the first spacer; and forming an S/D region in the silicon substrate at each of the two sides of gate structure, wherein the SiC region comprises a first portion overlapping the S/D region and a second portion underneath the LDD region, and a second concentration of crystalline SiC in the second portion is higher than a first concentration of crystalline SiC in the first portion.

Alternatively, in the above embodiment, the n type dopant may be implanted in the predetermined LDD regions before the carbon atoms is implanted for pre-amorphizing the silicon in the predetermined source/drain region and beneath the LDD region at each of the two sides of the gate structure.

Alternatively, in the above embodiment, the LDD region may be formed first and then followed by implanting carbon atoms, and thereafter, a rapid thermal process is performed to form SiC.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
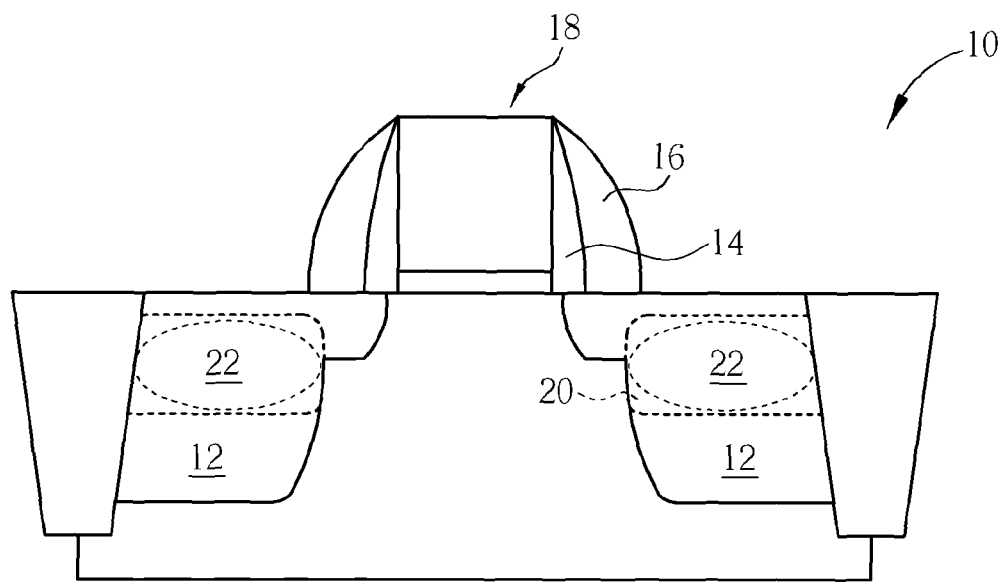
FIG. 1 is a schematic cross-sectional view of a conventional NMOS.
Figure 2:
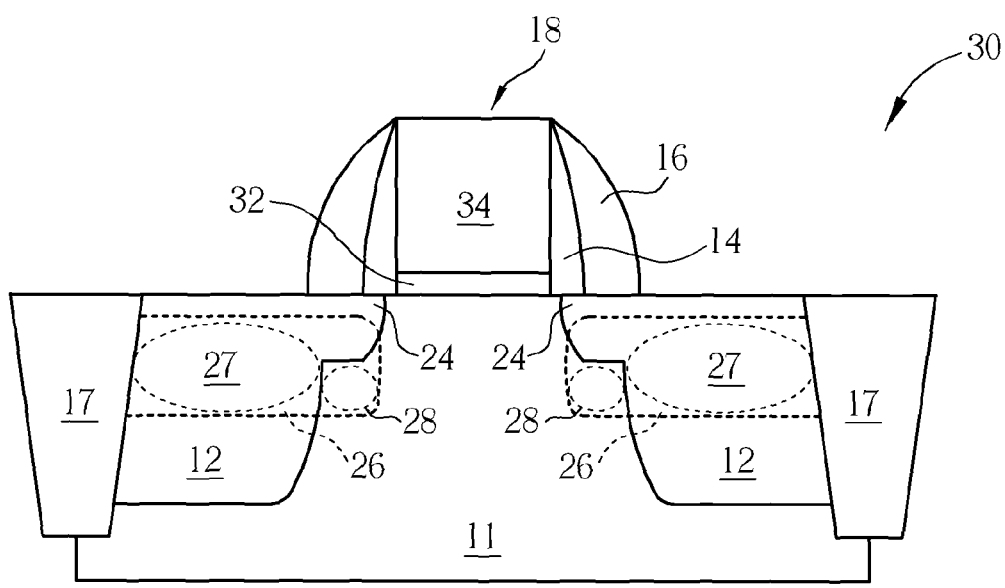
FIG. 2 is a schematic cross-sectional view of an NMOS transistor fabricated in one embodiment of the present invention.
Figure 3:
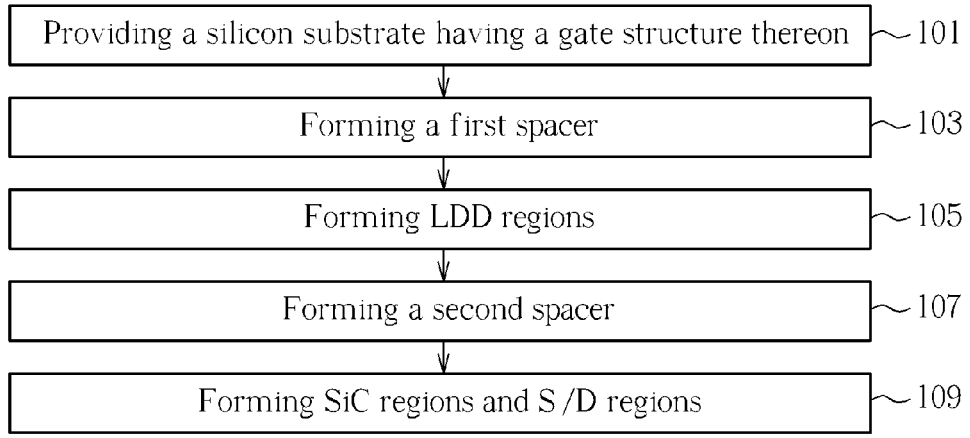
FIGS. 3-6 are flow charts illustrating some embodiments according to the present invention.

Please refer to FIG. 2 showing a schematic cross-sectional view of a MOS transistor desired in the present invention. The MOS transistor 30 may be fabricated by a method according to an embodiment of the present invention, as shown by the flow chart in FIG. 3. Referring to FIGS. 2 and 3, Step 101 is carried out to provide a silicon substrate 11 having a gate structure 18 thereon. The silicon substrate may be a silicon wafer or a silicon-on-insulator (SOI) substrate. The gate structure 18 may include a gate dielectric 32 and a gate 34. The gate dielectric 32 may include a high k (i.e. high dielectric constant) dielectric material and further an interlayer between the silicon substrate and the high k dielectric material. The gate 34 may include polysilicon or metal. A shallow trench isolation structure 17 may be formed to surround the active area of the MOS transistor 30.

Next, Step 103 is carried out to form a first spacer 14 on a sidewall of the gate structure 18. Thereafter, Step 105 is carried out to form a lightly doped drain (LDD) region 24 through doping an n type dopant, such as phosphorus or arsenic, of a light concentration in the silicon substrate 11 at each of two sides of the gate structure 18, using the first spacer 14 and the gate structure 18 as a mask, and a thermal annealing. Thereafter, Step 107 is carried out to form a second spacer 16 on the first space 14. The first and second spacers may each include silicon nitride, silicon oxide or one used conventionally.

Thereafter, Step 109 is carried out to form a SiC region 26 and an S/D region 12 in the silicon substrate at each of two sides of gate structure. The S/D region 12 is doped with an n type dopant, such as phosphorus or arsenic. In which, as shown in FIG. 2, the SiC region 26 (shown as the area surrounded by a dotted line) is formed in the substrate and includes a first portion 27 overlapping the S/D region 12 and a second portion 28 protruding from the S/D region 12 to a position beneath the LDD region 24. The concentration of crystalline SiC in the second portion 28 is higher than the concentration of crystalline SiC in the first portion 27. It may be also realized as that the average distribution density of crystalline SiC in the second region 28 protruding from the S/D region 12 to a position beneath the LDD region 24 is higher than that in the first region 27 overlapping the S/D region 12.

Figure 7:
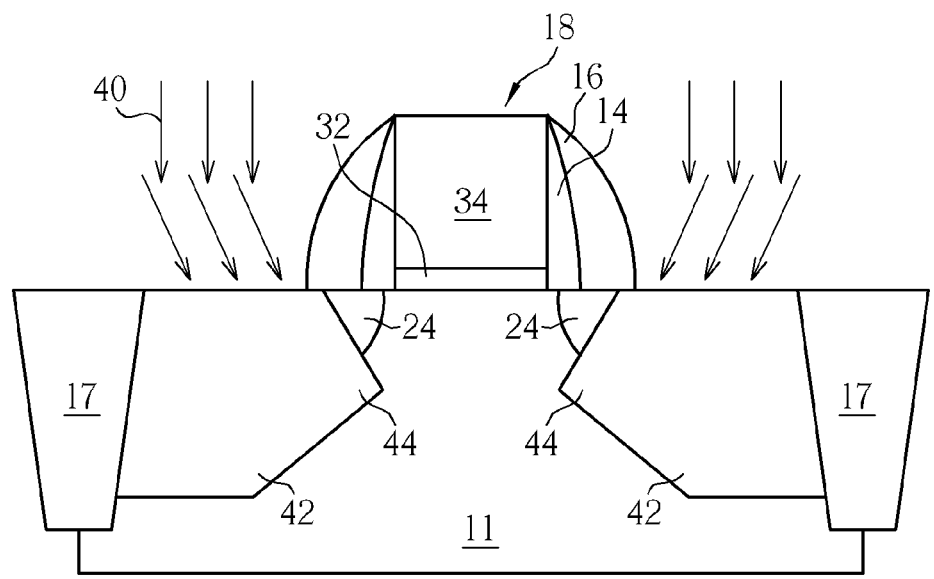
FIG. 7 is a schematic cross-sectional view for illustrating an embodiment according to the present invention.

Forming a SiC region 26 having the second portion 28 with a higher concentration of crystalline SiC and the first portion 27 with a lower concentration of crystalline SiC can be implemented in various ways. In one embodiment, as shown in the flow chart of FIG. 4, Step 109 as shown in FIG. 3 may include Steps 111, 113, and 115. In detail, referring to FIG. 4, after the second spacer 16 is formed, Step 111 may be formed through an ion implantation 40 to implant carbon atoms at a normal angle and a tilt angle into the silicon substrate 11 for pre-amorphizing the silicon at each of the two sides of the gate structure 18, as denoted by 42 in FIG. 7, for example. In one embodiment, the implant may be allowed to reach into the silicon substrate at a depth in the range from 100 to 300 angstroms, for example, about 200 angstroms, which may depend on a desired technology node. Since the implantation angle is tilted, the carbon atoms can reach the position 44 under the LDD regions 24. After the carbon atoms are implanted, an n type dopant (for forming S/D regions) is implanted into the silicon substrate 11 at each of the two sides of the gate structure 18 for doping. Thereafter, a rapid thermal process at a temperature for example in the range from 900 to 1100° C., such as about 1000° C., for about 5 to 6 seconds, and a laser spike annealing are carried out for forming the crystalline SiC and simultaneously forming the S/D regions 12 as shown in FIG. 2.

Figure 4:
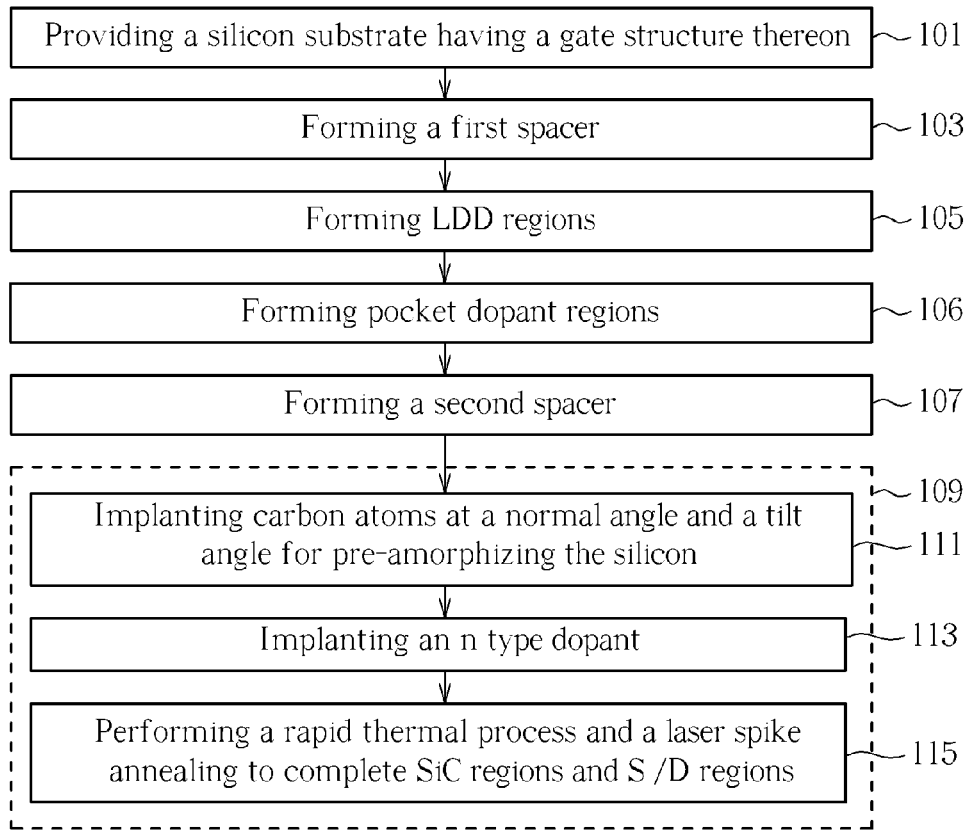

As shown in FIG. 4, a pocket dopant region may be formed by carrying out Step 106 to implant a p type dopant after the LDD regions are formed for inhibiting irregular punch-through phenomenon during the fabrication process. The formation of pocket dopant region can be carried out before or after LDD regions are formed, and the dopant is disposed at a position in front of the edge of the SiC region toward the channel region.

In FIG. 4, Step 113 is carried out after Step 111; while, alternatively, Step 113 may be carried out before Step 111. That is, the n type dopant may be implanted first, and then the carbon atoms are implanted at a normal angle and a tilt angle for pre-amorphizing the silicon. Thereafter, a rapid thermal process and a laser spike annealing are performed.

Figure 5:
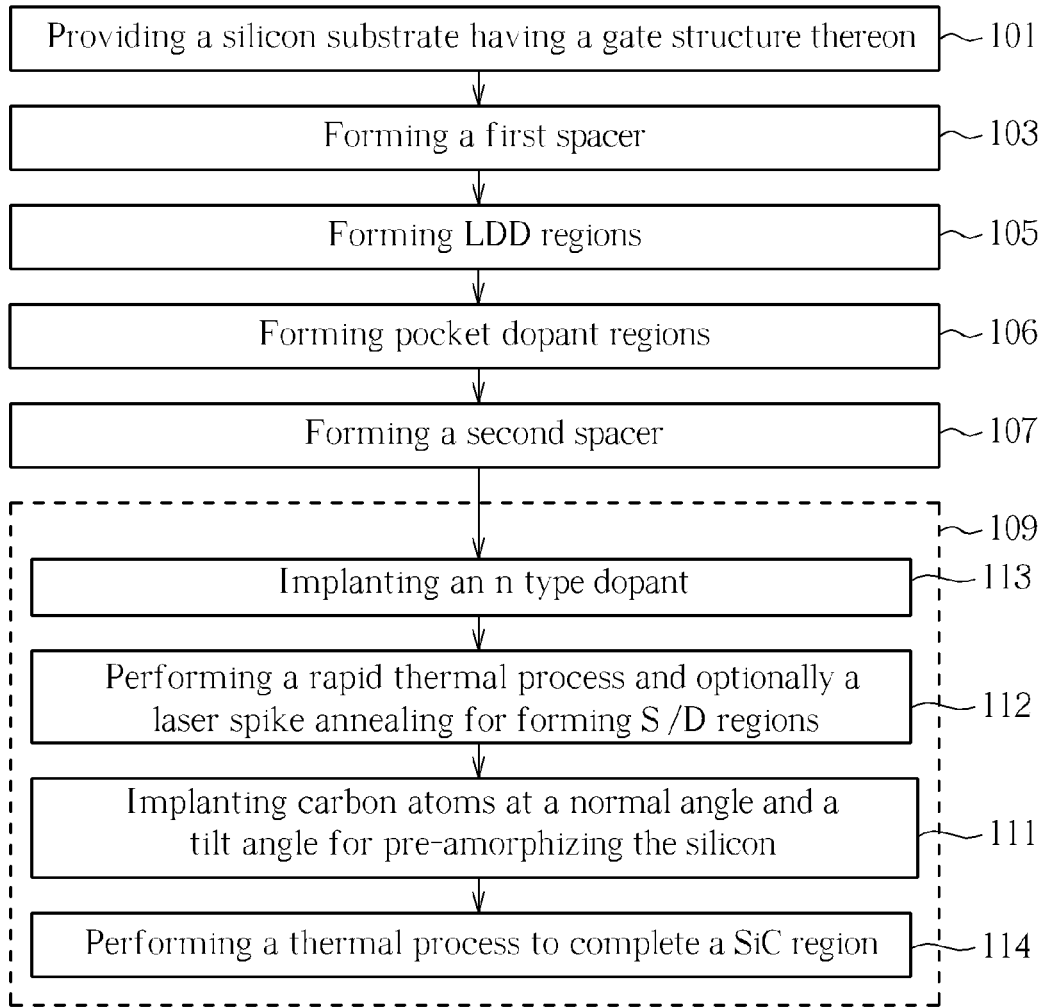

In still another embodiment, as shown in FIG. 5, Step 113 is also carried out before Step 111; while, Step 113 is followed by Step 112 to perform a rapid thermal process and optionally a laser spike annealing for forming the S/D regions, and Step 111 is followed by Step 114 to perform a laser spike annealing for forming the crystalline SiC.

Figure 6:
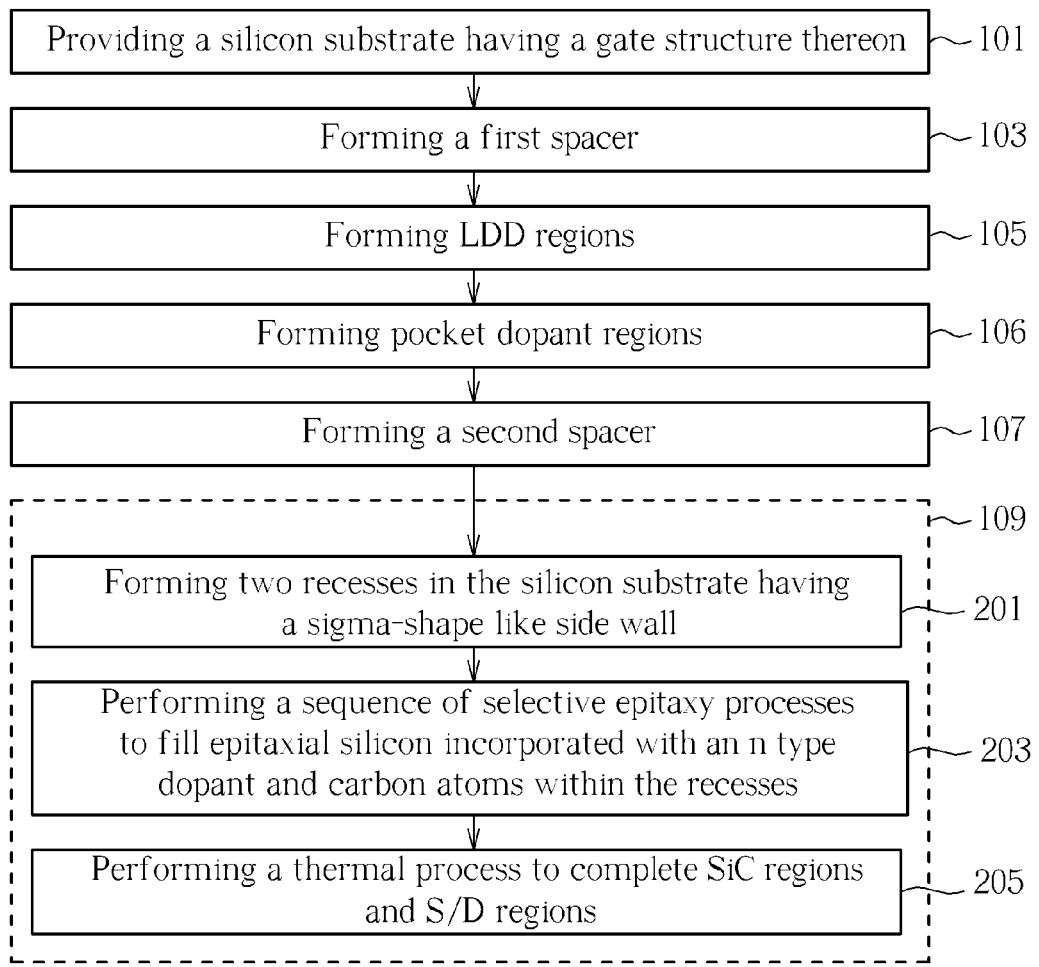
Figure 8:
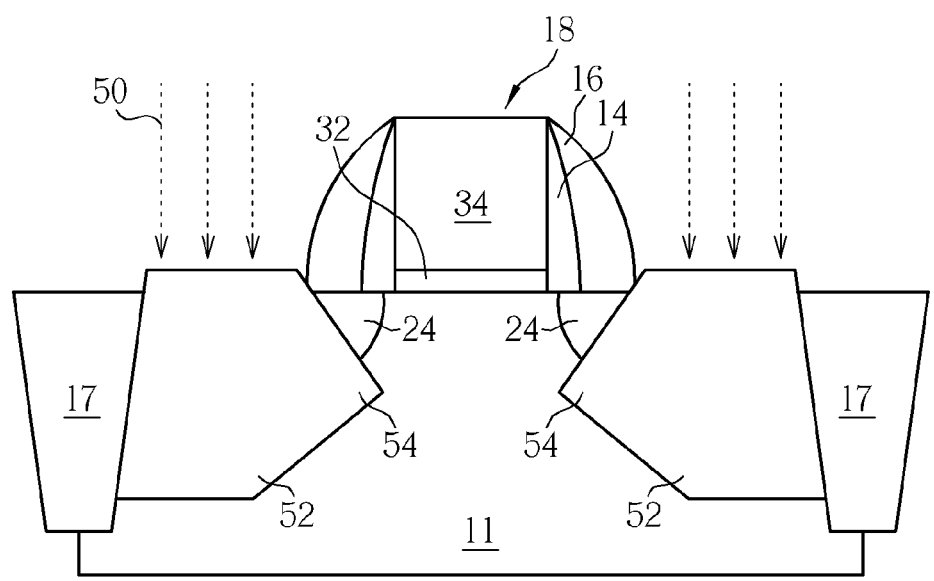
FIG. 8 is a schematic cross-sectional view for illustrating another embodiment according to the present invention.

In further another embodiment, the SiC regions may be formed by an SPE process with formation of S/D regions using epitaxial silicon simultaneously, as shown in FIG. 6 showing a flow chart and FIG. 8 showing a cross-sectional view. As shown in FIG. 6, after Step 107 to form a second spacer, the Step 109 of the embodiment illustrated by FIG. 2 may include Steps 201, 203, and 205. In detail, referring to FIG. 6 and FIG. 8, after the second spacer 16 is formed, Step 201 may be carried out to form two recesses in the silicon substrate at the two sides of the gate structure, for example, by etching. The recesses are each formed to have a sigma-shape like sidewall extruding to a position beneath each of the LDD regions 24. Then, Step 203 is carried out to perform a sequence of selective epitaxy processes 50 to fill epitaxial silicon incorporated with an n type dopant and carbon atoms within the recesses with a concentration of carbon atoms in the position beneath each of the LDD regions higher than the other position. Such concentration difference may be obtained by adjusting the source amount ratio of silicon, n type dopant and carbon during the epitaxy process according to the epitaxial position where the deposition of silicon, n type dopant, and carbon is going. For example, when the epitaxial deposition is taking place at the region 54, the carbon amount ratio in the source may be more than when the epitaxy deposition is taking place at other place. It should be noted that the process conditions should be adjusted to allow carbon atoms to locate at interstitial sites of the silicon crystal lattices, not to form as crystalline SiC, when they are just deposited within the recesses. Thereafter, Step 205 is carried out to perform a thermal process for re-crystallization to form the crystalline SiC and simultaneously form the S/D regions.

In another embodiment variant to the flow chart shown in FIG. 6, the epitaxial silicon may be incorporated with carbon atoms only, and the n type dopant is doped later. In detail, a sequence of selective epitaxy processes are performed to fill epitaxial silicon incorporated with carbon atoms within the recesses with a concentration of carbon atoms in the position beneath each of the LDD regions higher than the other position, and then an n type dopant is implanted at a normal angle into the silicon substrate at each of the two sides of the gate structure for doping. Thereafter, a thermal process is performed for forming the crystalline SiC and simultaneously forming the S/D regions.

Figure 9:
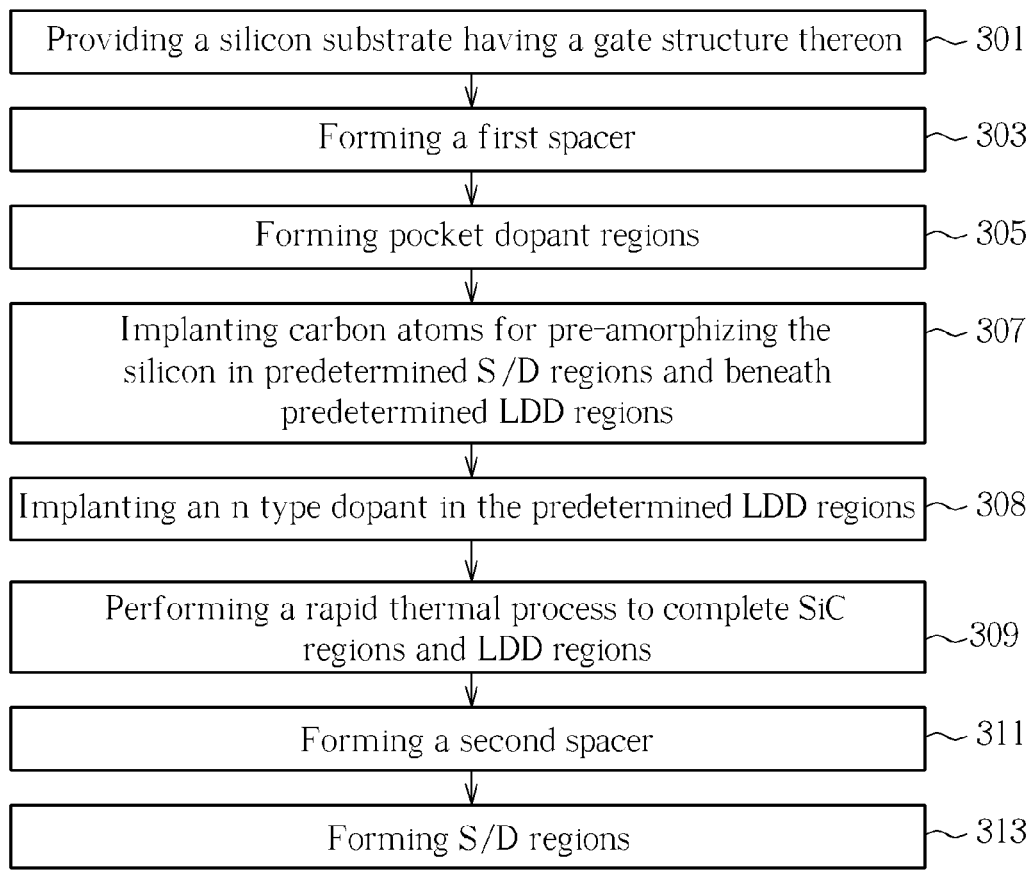
FIGS. 9 and 10 are flow charts illustrating other embodiments according to the present invention.

In other embodiments, the SiC regions may be formed before LDD regions are formed. As shown in FIG. 9, after Steps 301 and 303 to provide the substrate and form a first spacer, Step 305 may be optionally carried out to form pocket dopant regions. Step 307 is carried out to implant carbon atoms, generally just at a normal angle, into the silicon substrate for pre-amorphizing the silicon of the silicon substrate in a predetermined S/D region. Because the implantation is performed before LDD formation, the implant can reach to a place beneath a predetermined LDD region at each of the two sides of the gate structure. After implanting the carbon atoms, Step 308 is carried out to implant an n type dopant into the silicon substrate in the predetermined LDD regions. Thereafter, Step 309 is carried out to perform a rapid thermal process for completing the formation of the crystalline SiC and the LDD regions simultaneously. Then, Step 311 and Step 313 are performed to form a second spacer on the first spacer and to form S/D regions in the silicon substrate at each of the two sides of gate structure.

Alternative to the above embodiment, Step 308 may be performed to implant an n type dopant into the silicon substrate in the predetermined LDD regions before Step 307 of implanting carbon atoms is performed.

Figure 10:
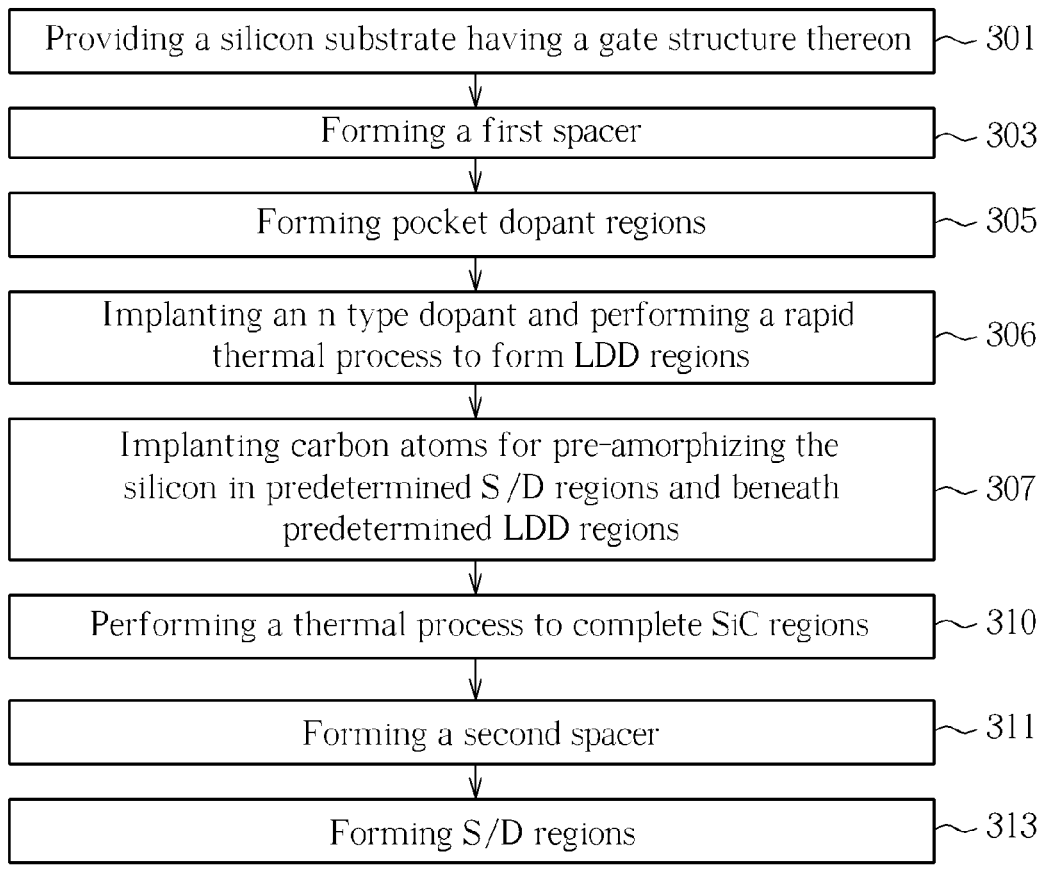

In another embodiment of formation of SiC regions before formation of the second spacer, as shown in FIG. 10 illustrating a flow chart, after Steps 301 and 303 to provide the substrate and form a first spacer, Step 305 is optionally carried out to form pocket dopant regions. Thereafter Step 306 is carried out to form an LDD region at each of the two sides of the gate structure by implanting an n type dopant and performing a rapid thermal process. Thereafter, Step 307 is carried out to implant carbon atoms, generally at a normal angle, into the silicon substrate for pre-amorphorizing the silicon of the silicon substrate in a predetermined S/D region and beneath the LDD region at each of the two sides of the gate structure. Thereafter, Step 310 is carried out to perform a thermal process to form two SiC regions. In one embodiment, the thermal process may be at about 600 to 700° C. for 60 minutes. A thermal process performed for forming a SiGe region in a PMOS transistor may be suitably utilized. Thereafter, Step 311 and Step 313 are carried out.

Carbon atoms (which may be presented as carbon atoms or in a carbon cluster or molecular moiety, as those conventionally used for carbon implantation) incorporated into the silicon in the present invention is preferably $1 \times 10^{20}$ to $1 \times 10^{22}$ atoms/cm$^3$. The carbon atoms are allowed to be incorporated in the silicon at interstitial sites of the silicon crystal lattices. When a thermal process is carried out, carbon gets the substitutional site of the silicon crystal lattice and becomes crystalline SiC. It is known that the concentration of carbon obtaining substitutional sites of silicon crystal (i.e. the carbon of crystalline SiC) in crystalline silicon matrix is limited up to about 2%, which may be deemed as a solid solubility of carbon in crystalline silicon. However, an n type dopant for an S/D region will compete against carbon for the substitutional site. The n type dopant gets the substitutional site more easily than carbon. Accordingly, a higher concentration of n type dopant leads to a lower concentration of silicon carbon. Since a portion of carbon atoms are incorporated into a region underneath the LDD region which does not overlap the S/D region, the concentration of crystal SiC will be higher due to no n type dopant existing for competition. In other hand, the carbon atoms incorporated into the region overlapping the S/D region will form SiC in a lower concentration due to competition against the n type dopant.

In the present invention, as illustrated by the above embodiments, the SiC region is formed to have a first portion overlapping the SiC region and a second portion underneath the LDD region, and the concentration of crystalline SiC in the second portion is higher than the concentration of crystalline SiC in the first portion. According to the investigation by P. W. Liu, T. F. Kuo, C. I. Li, Y. R. Wang, R. M. Huang, C. H. Tsai, C. T. Tsai, and G. H. Ma, in "DOPANT AND THERMAL INTERACTION ON SPE FORMED SIC FOR NMOS PERFORMANCE ENHANCEMENT," IEEE, 2009, especially the drawings FIGS. 9 and 10, which is incorporated entirely herein by reference, since a relatively high concentration of SiC (for example region 28 in FIG. 2, region 44 in FIG. 7, and region 54 in FIG. 8) is formed beneath LDD regions and very close to the channel region, the channel region can be well strained to gain electron mobility. The SiC concentration in other portion, such as region 27 in FIG. 2, of the SiC region is lower, and much less in the surface portion of the S/D regions, both of which contribute the main current path of the MOS transistor, and thus the Rs is not significantly increased even though the SiC concentration is higher in the portion beneath the LDD regions.

Those skilled in the art will readily observe that numerous modifications and alterations of the device and method may be made while retaining the teachings of the invention.

What is claimed is:

1. A method for fabricating an NMOS transistor, comprising:
   providing a silicon substrate having a gate structure thereon;
   forming a first spacer on a sidewall of the gate structure;
   forming a lightly doped drain (LDD) region in the silicon substrate at each of two sides of the gate structure;
   forming a second spacer on the first spacer; and
   after forming the second spacer, forming a silicon carbide region and a source/drain region in the silicon substrate at each of two sides of gate structure, wherein the silicon carbide region comprises a first portion overlapping the source/drain region and a second portion protruding from the source/drain region to a position beneath the LDD region, and a second concentration of crystalline silicon carbide in the second portion is higher than a first concentration of crystalline silicon carbide in the first portion.

2. The method of claim 1, wherein the step of forming the silicon carbide region and the source/drain region comprises:
   implanting carbon atoms at a normal angle and a tilt angle into the silicon substrate for pre-amorphorizing the silicon at each of the two sides of the gate structure;
   after implanting the carbon atoms, implanting an n type dopant into the silicon substrate at each of the two sides of the gate structure; and
   performing a rapid thermal process and a laser spike annealing for forming the crystalline silicon carbide and simultaneously forming the source/drain regions.

3. The method of claim 2, wherein the carbon atoms are implanted into the silicon substrate to reach a depth in a range from 100 to 300 angstroms.

4. The method of claim 2, wherein the rapid thermal process is performed at a temperature in a range from 900 to 1100° C.

5. The method of claim 1, wherein the step of forming the silicon carbide region and the source/drain region comprises:
   implanting an n type dopant into the silicon substrate at each of the two sides of the gate structure;
   after implanting the n type dopant, implanting carbon atoms at a normal angle and a tilt angle into the silicon substrate for pre-amorphorizing the silicon at each of the two sides of the gate structure; and
   performing a rapid thermal process and a laser spike annealing for forming the crystalline silicon carbide and simultaneously forming the source/drain regions.

6. The method of claim 5, wherein the carbon atoms are implanted into the silicon substrate to reach a depth in a range from 100 to 300 angstroms.

7. The method of claim 5, wherein the rapid thermal process is performed at a temperature in a range from 900 to 1100° C.

8. The method of claim 1, wherein the step of forming the silicon carbide region and the source/drain region comprises:
   implanting an n type dopant into the silicon substrate at each of the two sides of the gate structure;
   performing a rapid thermal process for forming the source/drain regions;
   after forming the source/drain regions, implanting carbon atoms at a normal angle and a tilt angle into the silicon substrate at each of the two sides of the gate structure for pre-amorphorizing the silicon; and
   performing a laser spike annealing for forming the crystalline silicon carbide.

9. The method of claim 8, wherein the carbon atoms are implanted into the silicon substrate to reach a depth in a range from 100 to 300 angstroms.

10. The method of claim 1, wherein the step of forming the silicon carbide region and the source/drain region comprises:
    implanting an n type dopant into the silicon substrate at each of the two sides of the gate structure;
    performing a rapid thermal process and a laser spike annealing for forming the source/drain regions;
    after forming the source/drain regions, implanting carbon atoms at a normal angle and a tilt angle into the silicon substrate at each of the two sides of the gate structure for pre-amorphorizing the silicon; and
    performing a laser spike annealing for forming the crystalline silicon carbide.

11. The method of claim 8, wherein the carbon atoms are implanted into the silicon substrate to reach a depth in a range from 100 to 300 angstroms.

12. The method of claim 1, wherein the step of forming the silicon carbide region and the source/drain region comprises:
    forming two recesses in the silicon substrate at the two sides of the gate structure, respectively, wherein the recesses each have a sigma-shape like sidewall extruding to a position beneath each of the LDD regions;
    performing a sequence of selective epitaxy processes to fill epitaxial silicon mixed with an n type dopant and carbon atoms within the recesses with a concentration of carbon atoms in the position beneath each of the LDD regions higher than the other position; and
    performing a thermal process for forming the crystalline silicon carbide and simultaneously forming the source/drain regions.

13. The method of claim 12, wherein the step of performing the thermal process comprises performing a laser spike annealing.

14. The method of claim 1, wherein the step of forming the silicon carbide region and the source/drain region comprises:
    forming two recesses in the silicon substrate at the two sides of the gate structure, respectively, wherein the recesses each have a sigma-shape like sidewall extruding to a position beneath each of the LDD regions;
    performing a sequence of selective epitaxy processes to fill epitaxial silicon mixed with carbon atoms within the recesses with a concentration of carbon atoms in the position beneath each of the LDD regions higher than the other position;
    implanting an n type dopant at a normal angle into the silicon substrate at each of the two sides of the gate structure for doping; and
    performing a thermal process for forming the crystalline silicon carbide and simultaneously forming the source/drain regions.

15. The method of claim 14, wherein the step of performing the thermal process comprises performing a laser spike annealing.

16. The method of claim 1, further comprising forming a pocket dopant region to dispose a p type dopant in front of an edge of the silicon carbide region toward a channel region of the NMOS transistor.

17. A method for fabricating an NMOS transistor, comprising:
    providing a silicon substrate having a gate structure thereon;
    forming a first spacer on a sidewall of the gate structure;
    implanting carbon atoms at a normal angle into the silicon substrate for pre-amorphorizing the silicon of the silicon substrate in a predetermined source/drain region and beneath a predetermined lightly doped drain (LDD) region at each of the two sides of the gate structure;
    after implanting the carbon atoms, implanting an n type dopant into the silicon substrate in the predetermined LDD regions;
    performing a rapid thermal process for forming the crystalline silicon carbide and simultaneously forming the LDD regions;
    forming a second spacer on the first spacer; and
    forming a source/drain region in the silicon substrate at each of the two sides of gate structure, wherein the silicon carbide region comprises a first portion overlapping the source/drain region and a second portion underneath the LDD region, and a second concentration of crystalline silicon carbide in the second portion is higher than a first concentration of crystalline silicon carbide in the first portion.

18. The method of claim 17, further comprising forming a pocket dopant region to dispose a p type dopant in front of an edge of the silicon carbide region toward a channel region of the NMOS transistor.

* * * * *